(12) United States Patent
Yasui et al.

(10) Patent No.: US 10,362,686 B2
(45) Date of Patent: Jul. 23, 2019

(54) LEAD-FREE SOLDER AND ELECTRONIC COMPONENT BUILT-IN MODULE

(71) Applicant: TDK CORPORATION, Tokyo (JP)

(72) Inventors: Tsutomu Yasui, Tokyo (JP); Hisayuki Abe, Tokyo (JP); Kenichi Kawabata, Tokyo (JP); Tomoko Kitamura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 408 days.

(21) Appl. No.: 14/862,607

(22) Filed: Sep. 23, 2015

(65) Prior Publication Data

US 2016/0008930 A1    Jan. 14, 2016

Related U.S. Application Data

(63) Continuation of application No. 13/005,838, filed on Jan. 13, 2011, now Pat. No. 9,258,905.

(30) Foreign Application Priority Data

Jan. 28, 2010   (JP) ................ 2010-017145

(51) Int. Cl.
| | |
|---|---|
| *C22C 19/03* | (2006.01) |
| *C22C 13/00* | (2006.01) |
| *B23K 35/30* | (2006.01) |
| *B23K 35/26* | (2006.01) |
| *B23K 35/02* | (2006.01) |
| *B32B 15/01* | (2006.01) |
| *H05K 3/34* | (2006.01) |

(52) U.S. Cl.
CPC ......... *H05K 3/3463* (2013.01); *B23K 35/025* (2013.01); *B23K 35/0227* (2013.01); *B23K 35/0244* (2013.01); *B23K 35/262* (2013.01); *B23K 35/3033* (2013.01); *C22C 13/00* (2013.01); *C22C 19/03* (2013.01); *H01L 2224/16225* (2013.01); *H01L 2924/19105* (2013.01); *H05K 3/3484* (2013.01)

(58) Field of Classification Search
None
See application file for complete search history.

(56) References Cited

U.S. PATENT DOCUMENTS 5,153,553 A * 10/1992 Ruehl ................ H01H 85/1755
                                                   337/273
5,346,775 A *  9/1994 Jin ........................... B23K 1/00
                                                   228/248.5

(Continued)

FOREIGN PATENT DOCUMENTS

| JP | 2001-062561 A | | 3/2001 |
|---|---|---|---|
| JP | 2003-112285 | * | 4/2003 |

(Continued)

OTHER PUBLICATIONS

May 22, 2015 Office Action issued in U.S. Appl. No. 13/005,838.

(Continued)

*Primary Examiner* — Humera N Sheikh
*Assistant Examiner* — Xiaobei Wang
(74) *Attorney, Agent, or Firm* — Oliff PLC

(57) ABSTRACT

First solder is lead-free solder that contains no lead (Pb). The first solder includes a first metal that contains at least Sn; and a second metal that contains at least a Ni—Fe alloy.

2 Claims, 5 Drawing Sheets

(56) References Cited

U.S. PATENT DOCUMENTS

| | | | |
|---|---|---|---|
| 5,868,304 | A | 2/1999 | Brofman et al. |
| 6,224,690 | B1 * | 5/2001 | Andricacos ............. B32B 15/01 148/400 |
| 6,231,691 | B1 | 5/2001 | Anderson et al. |
| 6,300,164 | B1 | 10/2001 | Call et al. |
| 6,337,445 | B1 | 1/2002 | Abbott et al. |
| 6,892,925 | B2 | 5/2005 | Interrante et al. |
| 2002/0114726 | A1 | 8/2002 | Soga et al. |
| 2002/0149114 | A1 | 10/2002 | Soga et al. |
| 2003/0090883 | A1 | 5/2003 | Asahi et al. |
| 2004/0050904 | A1 | 3/2004 | Interrante et al. |
| 2004/0052678 | A1 | 3/2004 | Takesue et al. |
| 2005/0029666 | A1 | 2/2005 | Kurihara et al. |
| 2007/0278456 | A1 | 12/2007 | Sakai et al. |
| 2009/0057378 | A1 | 3/2009 | Hwang et al. |
| 2009/0223830 | A1 | 9/2009 | Tsujimoto et al. |
| 2010/0154556 | A1 | 6/2010 | Yin |
| 2011/0156256 | A1 | 6/2011 | Kang et al. |

FOREIGN PATENT DOCUMENTS

| | | |
|---|---|---|
| JP | 2003-112285 A | 4/2003 |
| JP | 2006-263774 A | 10/2006 |
| WO | 03/021664 A1 | 3/2003 |

OTHER PUBLICATIONS

Feb. 10, 2015 Office Action issued in U.S. Appl. No. 13/005,838.
Jun. 27, 2014 Office Action issued in U.S. Appl. No. 13/005,838.
Jul. 11, 2013 Office Action issued in U.S. Appl. No. 13/005,838.
Mar. 19, 2013 Office Action issued in U.S. Appl. No. 13/005,838.

* cited by examiner

| AVERAGE PARTICLE DIAMETER [μm] | EVALUATION |
|---|---|
| 1 | NOT GOOD |
| 3 | GOOD |
| 5 | GOOD |
| 10 | VERY GOOD |
| 20 | GOOD |
| 30 | GOOD |
| 40 | GOOD |
| 50 | GOOD |
| 60 | FAIR |

FIG.9

| ADDITIVE AMOUNT (% BY MASS) | MELTING | WETTABILITY |
|---|---|---|
| 0 | NOT GOOD | VERY GOOD |
| 5 | GOOD | VERY GOOD |
| 10 | GOOD | VERY GOOD |
| 15 | GOOD | GOOD |
| 20 | GOOD | GOOD |
| 25 | VERY GOOD | GOOD |
| 30 | VERY GOOD | GOOD |
| 35 | VERY GOOD | FAIR |

LEAD-FREE SOLDER AND ELECTRONIC COMPONENT BUILT-IN MODULE

CROSS-REFERENCE TO RELATED APPLICATIONS

This application is a continuation application of U.S. application Ser. No. 13/005,838, filed Jan. 13, 2011, the contents of which are incorporated herein by reference.

This application is based upon and claims the benefit of priority from Japanese Patent Application No. 2010-017145, filed Jan. 28, 2010, the entire contents of which are incorporated herein by reference.

BACKGROUND OF THE INVENTION

1. Field of the Invention

The present invention relates to lead-free solder that contains no lead (Pb).

2. Description of the Related Art

Electronic component built-in modules each include a substrate and a plurality of electronic components, such as passive components and active components, which are mounted on the substrate by using solder so as to have integrated functions. To mount such electronic components on a substrate of an electronic device, a terminal electrode of the electronic component built-in module and a terminal electrode of the substrate are joined together by solder. Conventionally, Sn—Pb solder has been used to join electronic components together; however, lead-free manufacturing has been promoted with environmental issues as a backdrop, so that lead-free solder is popularly used except in fields related to automobiles and in special situations.

To mount an electronic component built-in module on a substrate by using solder, it is necessary to perform a reflow process to melt the solder. During such a reflow process, in some situations, pieces of solder joining the electronic components included in the electronic component built-in module to the substrate may melt and splash or the positions thereof may shift. To avoid such situations, it is necessary to join the electronic components included in the electronic component built-in module to the substrate by using such solder that does not melt at the reflow temperature that is used for mounting the electronic component built-in module to the substrate. For example, Japanese Laid-open Patent Publication No. 2001-62561 discloses a technique for brazing two members together by using a brazing material that is alloyed so as to have an arbitrary composition in such a manner that, when the two members to be brazed together are heated while being in contact with each other after metal layers that are made of mutually different types of metal and that are alloyed to serve as the brazing material are formed in the manner of stacked layers onto at least one of the two members, at least one of the metal layers is in a liquid phase whereas the other metal layer is caused to melt into the liquid-phase metal layer while a solid-phase state of the other metal layer is being included.

SUMMARY OF THE INVENTION

Lead-free solder according to an aspect of the present invention includes a first metal that contains at least Sn; and a second metal that contains at least a Ni—Fe alloy.

An electronic component built-in module according to another aspect of the present invention includes an electronic component and a substrate on which the electronic component is installed, wherein a terminal of the electronic component and a terminal of the substrate are joined together by using the lead-free solder according to the aspect of the present invention.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 2 is a side view depicting a manner in which the electronic component built-in module is attached to a substrate of an electronic device or the like;

FIG. 9 is a table showing results of evaluating additive amounts of the second metal.

DETAILED DESCRIPTION OF THE PREFERRED EMBODIMENTS

Exemplary embodiments of the present invention will be explained in detail below with reference to the accompanying drawings. The present invention is not limited to the embodiments described below. Further, the constituent elements disclosed in the embodiments described below include elements that can easily be conceived of by a person skilled in the art and elements that are substantially the same, i.e., elements that fall within a so-called scope of equivalents. Furthermore, the constituent elements disclosed in the embodiments described below may be used in combination, as necessary.

Figure 1:
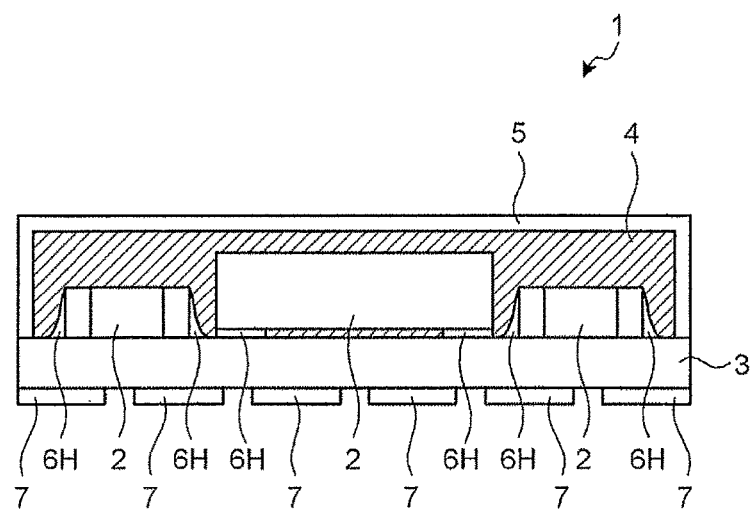
FIG. 1 is a cross-sectional view of an electronic component built-in module.
Figure 2:
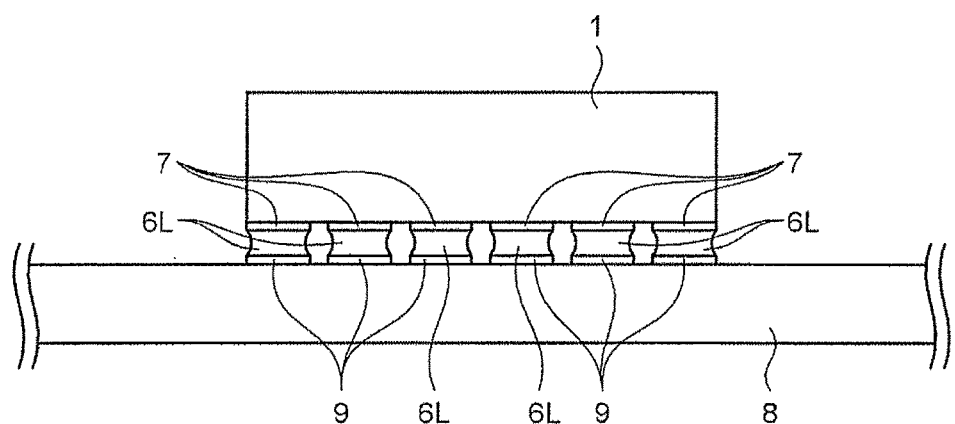

FIG. 1 is a cross-sectional view of an electronic component built-in module. FIG. 2 is a side view depicting a manner in which the electronic component built-in module is attached to a substrate of an electronic device or the like. As shown in FIG. 1, an electronic component built-in module 1 includes a substrate 3 and a plurality of electronic components 2 which are mounted on the substrate 3 so as to have integrated functions. The electronic components 2 may be mounted on a surface of the substrate 3 or may be mounted inside the substrate 3. According to an embodiment of the present invention described below, examples of the electronic components 2 structuring the electronic component built-in module 1 include passive components such as coils, capacitors, and resistors. Further, active components such as diodes and transistors as well as Integral Circuits (ICs) may be mounted as the electronic components 2, on a surface of the substrate 3 or inside the substrate 3. The examples of the electronic components 2 are not limited to the ones mentioned here.

As shown in FIG. 1, the electronic component built-in module 1 is configured to include the substrate 3 on which the electronic components 2 are mounted; an electrically-insulating resin 4 covering the electronic components 2; and a shield layer 5 coating the surface of the electrically-insulating resin 4. The electronic component built-in module 1 does not necessarily have to include the shield layer 5. Terminal electrodes of the electronic components 2 and terminal electrodes of the substrate 3 are joined together by lead-free solder (hereinafter, the "first solder") 6H according to the present embodiment. As a result, the electronic components 2 are mounted on the substrate 3. As described here, the first solder 6H is used for joining together the two members that are namely each of the terminal electrodes of the electronic components 2 and each of the terminal electrodes of the substrate 3.

As shown in FIG. 1, the electronic component built-in module 1 is configured in such a manner that the electronic components 2 mounted on the substrate 3 are covered by the electrically-insulating resin 4. Further, the electronic component built-in module 1 is configured in such a manner that one of the surfaces (hereinafter, the "component mount surface") of the substrate 3 on which the electronic components 2 are mounted is also covered by the electrically-insulating resin 4 at the same time. As described here, the electronic component built-in module 1 is configured so that, by covering the plurality of electronic components 2 and the component mount surface with the electrically-insulating resin 4, the substrate 3 and the plurality of electronic components 2 are integrated, and also, the strength thereof is ensured.

On the surface of the electrically-insulating resin 4 covering the plurality of electronic components 2, the shield layer 5 is formed. According to the present embodiment, the shield layer 5 is configured by using an electrically-conductive material (i.e., a material that has electric conductivity; a metal is used in the present embodiment). According to the present embodiment, the shield layer 5 may be configured by using a single electrically-conductive material or by using a layer that is made of two or more electrically-conductive materials. By coating the surface of the electrically-insulating resin 4, the shield layer 5 shields the electronic components 2 enclosed on the inside of the electrically-insulating resin 4 from high-frequency noises, electromagnetic waves, and the like that are caused on the outside of the electronic component built-in module 1, and also, the shield layer 5 blocks high-frequency noises and the like that are emitted from the electronic components 2. As explained here, the shield layer 5 functions as an electromagnetic shield. According to the present embodiment, the shield layer 5 coats the entire surface of the electrically-insulating resin 4; however, it is acceptable as long as the shield layer 5 coats the electrically-insulating resin 4 in such a manner that the shield layer 5 exerts certain functions that are required of an electromagnetic shield. The shield layer 5 therefore does not necessarily have to coat the entire surface of the electrically-insulating resin 4. In other words, it is acceptable if the shield layer 5 coats at least a part of the surface of the electrically-insulating resin 4.

The electronic component built-in module 1 can be manufactured by, for example, performing the following steps:

(1) Print a solder paste containing the first solder 6H onto the terminal electrodes of the substrate 3.

(2) Put the electronic components 2 on the substrate 3 by using a mounter.

(3) By putting the substrate 3, on which the electronic components 2 have been put, into a reflow furnace and heating the solder paste, cause the terminal electrodes of the electronic components 2 and the terminal electrodes of the substrate 3 to be joined together by melting and hardening of the first solder 6H, which is contained in the solder paste.

(4) Clean the flux that has adhered to the electronic components 2 and the surface of the substrate 3.

(5) Cover the electronic components 2 and the substrate 3 with the electrically-insulating resin 4.

The substrate 3 has terminal electrodes (i.e., module terminal electrodes) 7 on the side opposite to the component mount surface. The module terminal electrodes are electrically connected to the electronic components 2 included in the electronic component built-in module 1. Also, the module terminal electrodes 7 are joined to terminal electrodes (i.e., device substrate terminal electrodes) 9 provided on a substrate (e.g., a substrate of an electronic device; hereinafter, the "device substrate") 8 to which the electronic component built-in module 1 is attached, as shown in FIG. 2, by solder (hereinafter, the "second solder") 6L. With these arrangements, the electronic component built-in module 1 is configured so that electric signals and electric power can be exchanged between the electronic components 2 and the device substrate 8.

The device substrate 8 shown in FIG. 2 is a substrate on which the electronic component built-in module 1 is mounted. The device substrate 8 is, for example, installed in an electronic device (e.g., a vehicular electronic device, a portable electronic device, or the like). To mount the electronic component built-in module 1 on the device substrate 8, for example, a solder paste containing the second solder 6L is printed on the device substrate terminal electrodes 9, and subsequently, the electronic component built-in module 1 is put onto the device substrate 8 by using a mounting device. Further, by putting the device substrate 8 on which the electronic component built-in module 1 has been mounted into a reflow furnace and heating the solder paste, the module terminal electrodes 7 and the device substrate terminal electrodes 9 are joined together by melting and hardening of the second solder 6L, which is contained in the solder paste. Subsequently, the flux that has adhered to the surfaces of the electronic component built-in module 1 and the device substrate 8 is cleaned.

The melting temperature of lead-free solder that is popularly used these days is approximately 220° C., and the maximum temperature during a reflow process is approximately in the range from 240° C. to 260° C. As described above, when the electronic component built-in module 1 is mounted on the device substrate 8, the first solder 6H used for mounting the electronic components 2 structuring the electronic component built-in module 1 on the substrate 3 is to go through a reflow process. For this reason, such solder (i.e., high-temperature solder) that does not melt at the temperature used during the reflow process is used as the first solder 6H.

Some solder containing lead (Pb) has a melting temperature of approximately 300° C.; however, there is no lead-free solder of which the melting temperature is equal to or higher than 260° C. and that also has appropriate characteristics. For this reason, when lead-free solder is used, there is no choice but to use two types of solder between which the difference in the melting temperatures is small, as the solder (i.e., the first solder 6H) that is used in the joining process performed on the electronic components 2 that structure the electronic component built-in module 1 and as the solder (i.e., the second solder 6L) that is used for mounting the electronic component built-in module 1 on the device substrate 8.

In the case where the solder used in the joining process performed on the electronic components 2 that structure the electronic component built-in module 1 melts again during the reflow process, problem arises where the positions of the pieces of the first solder 6H shift and where the solder flushes (i.e., the solder splashes). As a result, there is a possibility that a short circuit or a contact failure of the electronic components 2 may occur. For this reason, as the solder used in the joining process performed on the electronic components 2 that structure the electronic component built-in module 1, it is desirable to use such solder that does not re-melt during the reflow process performed to mount the electronic component built-in module 1 or to use such solder of which the level of re-melting is only to an extent that does not cause the positions of the pieces of the first solder 6H to shift and does not cause flushing of the solder. An electrically-conductive adhesive agent (e.g., an Ag paste) may serve as an alternative for solder having a high melting temperature; however, because such an electrically-conductive adhesive agent has problems where the mechanical strength thereof is low, the electric resistance thereof is high, and the cost there of is high, electrically-conductive adhesive agents are not popularly used as an alternative for solder. The first solder 6H that is used in the joining process performed on the electronic components 2 that structure the electronic component built-in module 1 according to the present embodiment is lead-free solder that satisfies the requirements described above.

Figure 3:
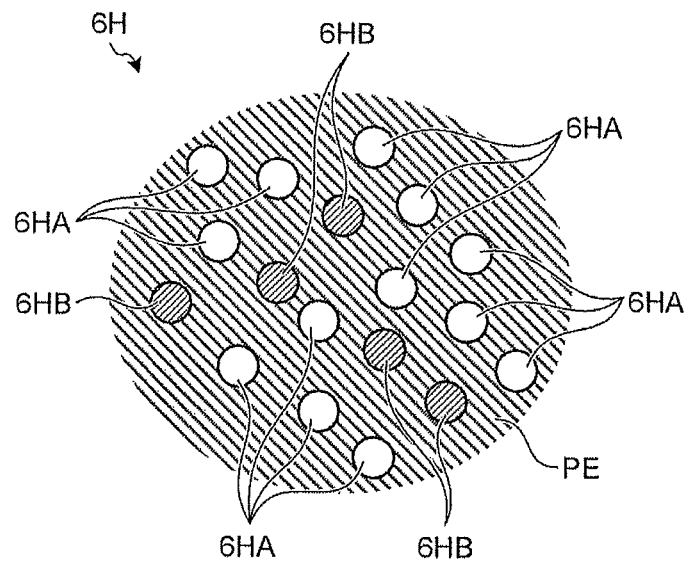
FIG. 3 is a conceptual drawing for explaining lead-free solder according to an embodiment of the present invention.
Figure 4:
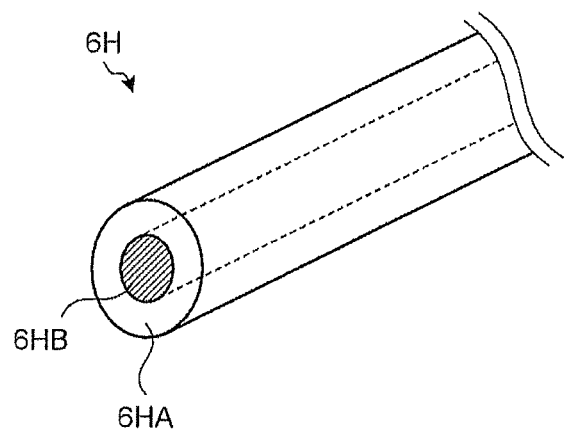
FIG. 4 is another conceptual drawing for explaining the lead-free solder according to the embodiment.

FIGS. 3 and 4 are conceptual drawings for explaining the lead-free solder according to the present embodiment. The lead-free solder according to the present embodiment (i.e., the first solder 6H) prior to use (i.e., prior to melting) includes: a first metal 6HA that contains at least tin (Sn); and a second metal 6HB that contains at least a nickel-iron (Ni—Fe) alloy. The first solder 6H shown in FIG. 3 is in the form of a solder paste that is obtained by dispersing the particulate first metal 6HA and the particulate second metal 6HB into a paste material PE. The first solder 6H shown in FIG. 4 is solder in the form of a wire that is obtained by using the second metal 6HB as a core and coating the outside of the core with the first metal 6HA. As described here, it is acceptable as long as, the first solder 6H, prior to the melting, is in such a state where the second metal 6HB containing at least a Ni—Fe alloy has been added to the first metal 6HA.

Although the first metal 6HA contains at least Sn, the first metal 6HA does not contain lead (Pb) because the first solder 6H is lead-free solder. According to the present embodiment, the second metal 6HB contains at least a Ni—Fe alloy. More specifically, the second metal 6HB necessarily contains a Ni—Fe alloy and may additionally contain at least one selected from a group consisting of cobalt (Co), molybdenum (Mo), copper (Cu), and chromium (Cr).

According to the present embodiment, as the first metal 6HA, solder (i.e., lead-free solder) that is tin-silver (Sn—Ag)-based or tin-copper (Sn—Cu)-based (which contains 90% by mass or more of Sn) is used. For example, as the first metal 6HA, it is possible to use Sn-3.5% Ag, Sn-3% Ag-0.5% Cu, or Sn-0.75% Cu. After a reflow process has been performed, the composition of the solder described here is such that Sn layers constitute a majority. Thus, when the reflow process has been performed a plurality of times, the Sn layers melt again. According to the present embodiment, to cope with this situation, as a metal that easily forms a compound with the Sn during the reflow processes, the second metal 6HB that contains at least a Ni—Fe alloy is added to the first metal 6HA. As explained here, the Ni—Fe alloy is added to the first metal 6HA. As a result, when the first solder 6H is melted for the first time, the Sn contained in the first metal and the Ni—Fe contained in the second metal are caused to react with each other, so that it is possible to obtain a composition that has a high level of heat resistance when the first solder 6H becomes hard. Further, even in the case where, for example, the first solder 6H is heated in the reflow process that is performed again or the like, it is possible to suppress the re-melting of the first solder 6H.

Figure 5:
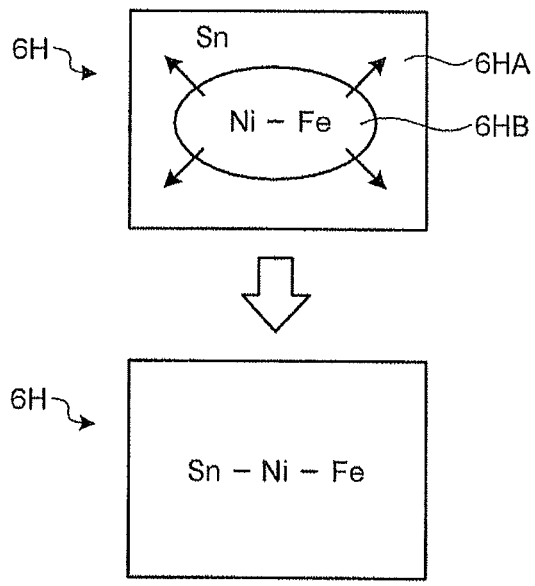
FIG. 5 is a conceptual drawing for explaining changes that occur when the lead-free solder according to the present embodiment is melted.
Figure 6:
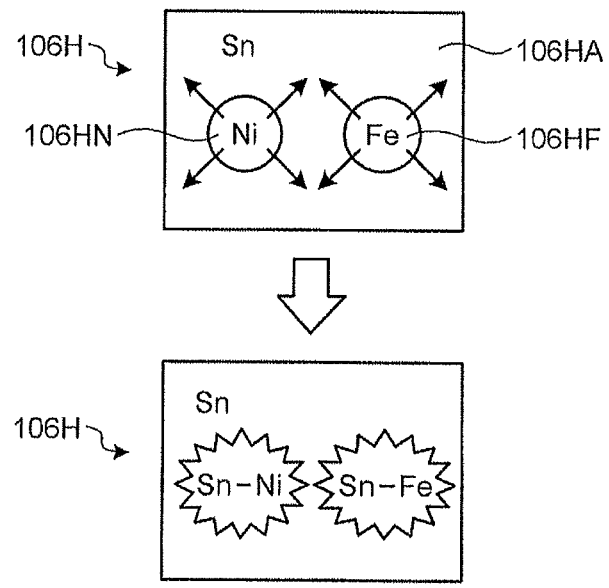
FIG. 6 is a conceptual drawing for explaining changes that occur when lead-free solder obtained by individually adding Ni and Fe to a first metal is melted.

FIG. 5 is a conceptual drawing for explaining changes that occur when the lead-free solder according to the present embodiment is melted. FIG. 6 is a conceptual drawing for explaining changes that occur when lead-free solder obtained by individually adding Ni and Fe to the first metal is melted. In the case where the first solder 6H (i.e., the lead-free solder according to the present embodiment) is heated and melted, as shown in FIG. 5, the reaction between the Sn and the Ni—Fe alloy progresses uniformly, so that the composition of the first solder 6H that had previously been melted and has subsequently become hard is close to be in a single phase of which the main components are Sn—Ni—Fe. As a result, the first solder 6H that had previously been melted and has subsequently become hard has a melting point that is higher than the melting point thereof prior to the melting. Consequently, even if the first solder 6H that had previously been melted is re-heated during the reflow process, the first solder 6H either does not melt or the melting thereof is suppressed.

Further, it has been confirmed that, no matter how many times the first solder 6H is re-heated later at a temperature lower than the melting point thereof, defects including cracks in the electrically-insulating resin 4 and flushing of the solder will not occur in the first solder 6H of which the composition is close to be in a single phase of Sn—Ni—Fe. Thus, the durability of the first solder 6H is improved. In particular, flushing of the solder is more likely to occur in the re-heating process during the reflow processes, in the case where the electronic component built-in module 1 includes the shield layer 5 shown in FIG. 1; however, by using the first solder 6H, it is possible to effectively inhibit such flushing of the solder. As explained here, by using the first solder 6H in the case where the electronic component built-in module 1 includes the shield layer 5, it is especially effective for improvements of product quality and durability of the electronic component built-in module 1.

Further, according to the present embodiment, the second metal 6HB that contains the Ni—Fe alloy, which easily reacts with Sn, is added to the first metal 6HA of which the base material is Sn. As a result, it is possible to cause the reaction between the Sn and the Ni—Fe alloy to progress rapidly in a short period of time required to perform the reflow process. Consequently, it is possible to easily cause the composition of the first solder 6H to be in a single phase of Sn—Ni—Fe, after the first solder 6H has become hard.

In an example of first solder 106H shown in FIG. 6 that is obtained by individually adding nickel 106HN and iron 106HF to a first metal 106HA, when the first solder 106H is heated and melted, the reaction between the Sn and the Ni (nickel) and the reaction between the Sn and the Fe (iron) progress with higher priorities. As a result, the ratio of Sn that does not completely react and remains in a single phase is higher, and the composition is not uniform. Consequently, the first solder 106H that had previously been melted and has subsequently become hard has a large portion of Sn phase having a low melting temperature. In this situation, the melting point of the first solder 106H is not higher than the melting point thereof prior to the melting. As a result, when the first solder 106H that had previously been melted is re-heated during a reflow process, the first solder 106H melts. In contrast, according to the present embodiment, by adding the Ni—Fe alloy to the first metal 6HA, it is possible to arrange, after the first solder 6H had once been melted, the melting point of the first solder 6H to be higher than the melting point thereof prior to the melting, so as to realize the situation where it is possible to avoid the melting or to suppress the melting.

To raise the melting point of the first solder 6H that had previously been melted and has subsequently become hard, it is necessary to cause the Sn and the Ni—Fe to react with each other more uniformly during the melting so that the composition of the first solder 6H after the hardening is closer to be in a single phase of Sn—Ni—Fe. Consequently, it is desirable to configure the first metal 6HA and the second metal 6HB included in the first solder 6H prior to the melting so as to be particulate, as shown in FIG. 3. With this arrangement, because the area in which the first metal 6HA and the second metal 6HB are in contact with each other is increased, it is possible to cause the Sn and the Ni—Fe to react with each other more uniformly. As a result, it is easier for the composition of the first solder 6H that had once been melted and has subsequently become hard to be in the single phase of Sn—Ni—Fe. Consequently, it is possible to raise, with higher certainty, the melting point of the first solder 6H that had previously been melted and has subsequently become hard. As shown in FIG. 4, in the case where the first solder 6H prior to the melting is configured in the form of a wire, it is desirable to configure at least the second metal 6HB so as to be particulate.

Figures 7, 8:
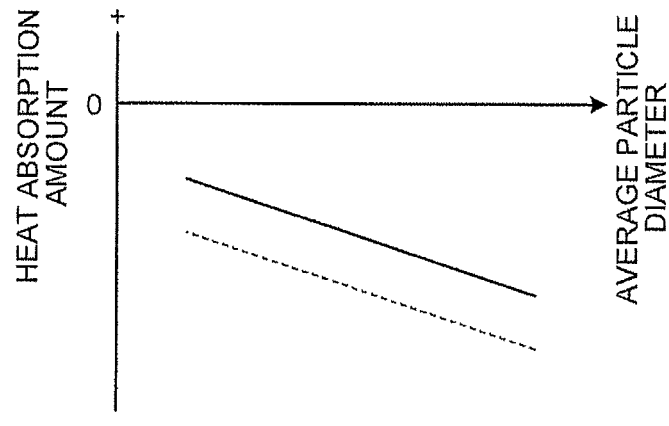
FIG. 7 shows a relationship between average particle diameters of a second metal and heat absorption amounts.
FIG. 8 is a table showing results of evaluating a desirable range for the average particle diameter of the second metal.

FIG. 7 shows a relationship between average particle diameters of the second metal and heat absorption amounts. The results shown in FIG. 7 were obtained by preparing a plurality of samples of the first solder 6H by varying the diameter of the second metal 6HB included in the first solder 6H and heating so as to cause each of the samples of the first solder 6H to melt, and subsequently allowing each of the samples to become hard, before calculating a heat absorption amount when each of the samples is re-heated at a reflow temperature that is in the range from 240° C. to 260° C. The heat absorption amounts were measured by using a heat flux differential scanning calorimeter (i.e., DSC-50 manufactured by Shimadzu Corporation). The broken line shown in FIG. 7 indicates a result that was obtained when the ratio of the second metal 6HB to the total mass of the first solder 6H (the sum of the mass of the first metal 6HA and the mass of the second metal 6HB) was 10% by mass, whereas the solid line indicates a result that was obtained when the ratio of the second metal 6HB was 25% by mass. In the case where a heat absorption amount is a negative value, it means that the first solder 6H absorbs the thermal energy caused in the heating process and uses the thermal energy for its own melting. If a heat absorption amount is a negative value, the larger the absolute value of the heat absorption amount is, the more thermal energy the first solder 6H absorbs, i.e., the easier it is for the first solder 6H to melt.

As understood from the results shown in FIG. 7, a tendency is that the smaller the average particle diameter of the second metal 6HB is, the less thermal energy the first solder 6H absorbs. This tendency is the same even if the ratio of the second metal 6HB is different. The smaller the average particle diameter of the second metal 6HB becomes, the larger is the area in which the first metal 6HA and the second metal 6HB are in contact with each other when the first solder 6H is melted, and therefore, the easier it is for the reaction between the Sn and the Ni—Fe alloy to progress. As a result, the composition of the first solder 6H after the hardening is closer to be in a single phase, and it is therefore possible to obtain a higher melting point. In contrast, the smaller the average particle diameter of the second metal 6HB is, the more difficult it is to produce or to handle the particles of the second metal 6HB. In consideration of how close the composition of the first solder 6H is to be in a single phase after the hardening and how easy it is to produce or to handle the particles of the second metal 6HB, we evaluated each of different average particle diameters of the second metal 6HB. The average particle diameters were measured by using a laser diffraction particle size distribution measuring device (i.e., SALD-2200 manufactured by Shimadzu Corporation).

FIG. 8 is a table showing the results of evaluating a desirable range for the average particle diameter of the second metal. When the evaluation is indicated as "Good" or "Very Good", it means that the average particle diameter is acceptable. In the evaluation results, when the average particle diameter of the second metal 6HB exceeds 50 micrometers and reaches 60 micrometers, the proportion of mutually-different phases in the composition of the first solder 6H after the hardening becomes higher, so that the increase in the melting point becomes smaller for the first solder 6H that had previously been melted and has subsequently becomes hard. For this reason, because a problem is expected to occur when a reflow process is performed again, we made an evaluation indicating that the average particle diameter of 60 micrometers is not acceptable. Further, when the average particle diameter of the second metal 6HB is smaller than 3 micrometers, it becomes difficult to produce or to handle the particles of the second metal 6HB. Thus, it has been determined that the average particle diameter of the second metal 6HB should be 3 micrometers or larger in consideration of handleability and the like. When the average particle diameter of the second metal 6HB is smaller than 5 micrometers, because the surface area with respect to the particle diameter is large, the second metal 6HB has a higher tendency of getting oxidized. In that situation, there is a possibility that some of the particles may remain on the substrate as oxidized particles, without melting in a re-heating process during the reflow process. In contrast, the average particle diameter of the second metal 6HB being equal to or larger than 5 micrometers is more desirable because it is possible to suppress the remaining of the oxidized particles.

Accordingly, according to the present embodiment, it is desirable to arrange the average particle diameter of the second metal 6HB to be in the range from 3 micrometers to 50 micrometers inclusive, and more preferably, in the range from 5 micrometers to 30 micrometers inclusive. When the particles of the second metal 6HB that fall in such a range are used, the composition of the first solder 6H after the hardening is closer to be in a single phase of Sn—Ni—Fe. Thus, it is possible to effectively raise the melting point of the first solder 6H that had previously been melted and has subsequently become hard. According to the present embodiment, although the average particle diameter of the first metal 6HA is not defined particularly, it is acceptable to arrange the average particle diameter of the first metal 6HA to fall in a range that is similar to the range for the average particle diameter of the second metal 6HB. As additional information, according to the present embodiment, the average particle diameter of the first metal 6HA is arranged to be in the range from 25 micrometers to 36 micrometers.

FIG. 9 is a table showing results of evaluating additive amounts of the second metal. When the evaluation is indicated as "Good" or "Very Good", it means that the additive amount is acceptable. The evaluation results shown in FIG. 9 were obtained by preparing a plurality of samples of the first solder 6H by varying the ratio (i.e., the additive ratio) of the second metal 6HB to the total mass of the first solder 6H (the sum of the mass of the first metal 6HA and the mass of the second metal 6HB). The evaluations were made on two factors that are namely (1) the level of melting when the first solder 6H that had previously been melted and has subsequently become hard is re-heated in a heating temperature used in a reflow process; and (2) wettability of the first solder 6H, which is in a state where the second metal 6HB has been added to the first metal 6HA, is melted for the first time. The additive amount of the second metal 6HB is the additive ratio (% by mass) described above.

As understood from the chart shown in FIG. 9, the larger the additive amount of the second metal 6HB is, the lower is the level of melting of the first solder 6H in the re-heating process. In the case where the additive amount of the second metal 6HB is 5%, the first solder 6H melts to a certain extent in the re-heating process. However, when the electronic components 2 shown in FIG. 1 were actually installed in the electronic component built-in module 1 by using the first solder 6H in which the additive amount of the second metal 6HB is 5% so that a reflow process was actually performed on the electronic component built-in module 1 mounted on the device substrate 8, no flushing of the solder and no shifting of the positions of the pieces of the first solder 6H were observed in the electronic component built-in module 1. Consequently, the additive amount of 5% was determined to be acceptable.

The wettability of the first solder 6H becomes higher as the additive amount of the second metal 6HB increases. In other words, it becomes easier for the first solder 6H to spread. When the additive amount of the second metal 6HB exceeds 30% and reaches 35%, the wettability becomes so low that there is a possibility that self-alignment effect of the electronic components 2 during the reflow process may become low. For this reason, as for the wettability, the upper limit of the additive amount of the second metal 6HB was determined to be 30%. According to the present embodiment, it is desirable to arrange the additive ratio of the second metal 6HB to be in the range from 5% by mass to 30% by mass inclusive. When the additive ratio of the second metal 6HB is within this range, even if a reflow process is performed again when the electronic component built-in module 1 is installed on the device substrate 8, after the electronic components 2 have been installed on the substrate 3 in the electronic component built-in module 1 by using the first solder 6H, it is possible to inhibit the flushing of the solder and the shifting of the positions of the pieces of the first solder 6H. Further, when the electronic components 2 are installed on the substrate 3 by using the first solder 6H, it is also possible to obtain the self-alignment effect appropriately so as to be able to position the electronic components 2. As explained above, in the case where the additive ratio of the second metal 6HB is within the range described above, the first solder 6H is suitable for the use in the installation process performed on the electronic components 2 that structure the electronic component built-in module 1.

Powder of the second metal 6HB is produced by using, for example, a metal powder producing method such as a water atomizing method or a gas atomizing method. In the case where a water atomizing method is used, the surface of the produced powder becomes oxidized. In the case where the first solder 6H is obtained by adding the second metal 6HB to the first metal 6HA while the surface of the powder of the second metal 6HB is oxidized, the powder of the second metal 6HB in a melting state gathers on the surface of the hardened first solder 6H due to oxidization films. As a result, almost all of the first metal 6HA and the second metal 6HB become separated from each other. Consequently, the reaction between the first metal 6HA and the second metal 6HB is not accelerated, and it is therefore not possible to expect the melting point of the first solder 6H to rise.

Accordingly, in the case where the second metal 6HB becomes oxidized during the process of producing the metal powder, the second metal 6HB should be added to the first metal 6HA after having been reduced in, for example, a hydrogen ambient. With this arrangement, the first metal 6HA is configured in such a manner that the reaction between the first metal 6HA and the second metal 6HB is accelerated during the first melting process. Thus, the composition is close to be in a single phase of Sn—Ni—Fe. As a result, it is possible to ensure that the first solder 6H that had previously been melted and has subsequently become hard has a melting point that is higher than the melting point thereof prior to the melting.

The acceleration of the reaction between the first metal 6HA and the second metal 6HB was evaluated, while using the amount of oxygen contained in the powder of the second metal 6HB as a parameter. As a result, in the case where the ratio of the oxygen contained in the powder of the second metal 6HB is 1.5% by mass, the acceleration of the reaction between the first metal 6HA and the second metal 6HB is insufficient, and it is not possible to expect the melting point of the first solder 6H to rise. In contrast, in the case where the ratio of the oxygen contained in the powder of the second metal 6HB becomes as low as 0.24% by mass, the reaction between the first metal 6HA and the second metal 6HB is accelerated, so that the melting point of the first solder 6H rises.

In the case where the ratio of the Fe contained in the second metal 6HB is equal to or larger than 8% by mass, a rise is observed in the melting point of the first solder 6H that had previously been melted and has subsequently become hard. In the case where the ratio of the Fe is equal to or higher than 5% by mass, the melting point of the first solder 6H that had previously been melted and has subsequently become hard becomes higher than the temperature (in the range from 240° C. to 260° C.) that is used in the reflow process to be performed again. In contrast, in the case where the ratio of the Fe exceeds 16% by mass, the proportion by which the phase having Sn—Ni—Fe as the main components thereof is present as a single phase becomes small, so that the melting temperature of the first solder 6H also becomes low. Accordingly, it is desirable to arrange the ratio of the Fe contained in the second metal 6HB to be in the range from 5% by mass to 16% by mass inclusive, and more preferably, in the range from 8% by mass to 16% by mass inclusive.

As for the first solder 6H obtained by adding the second metal 6HB that contains at least a Ni—Fe alloy to the first metal 6HA that contains at least Sn, it is desirable to perform a heat treatment process on the first solder 6H, after the first solder 6H had been melted for the first time and has subsequently become hard. The heat treatment process is performed by keeping the first solder 6H at a predetermined temperature for a predetermined period of time. For example, the first solder 6H that had previously been melted and has subsequently become hard is kept at a temperature that is equal to or higher than 180° C. for a time period of 20 minutes to 30 minutes. As a result of the heat treatment process, the reaction between the Sn contained in the first metal 6HA and the Ni—Fe alloy contained in the second metal 6HB is accelerated. As a result, the composition of the first solder 6H is closer to be in a single phase of Sn—Ni—Fe. Consequently, it is possible to raise the melting point of the first solder 6H without fail.

As explained above, according to the present embodiment, the lead-free solder (i.e., the first solder 6H described above) is obtained by adding the second metal that contains at least a Ni—Fe alloy to the first metal that contains at least Sn. In the process during which the lead-free solder is melted for the first time, the reaction between the Sn contained in the first metal and the Ni—Fe alloy contained in the second metal progresses uniformly and quickly. The composition of the lead-free solder that had previously been melted and has subsequently become hard is close to be in a single phase of Sn—Ni—Fe. Thus, the lead-free solder that had been melted for the first time and has subsequently become hard has a melting point that is higher than the melting point thereof prior to the first melting and therefore has a higher level of heat resistance. As a result, even if the lead-free solder that had once been melted is re-heated in a reflow process performed later, the lead-free solder either does not melt or the melting thereof is suppressed.

By using the lead-free solder that is configured as described above in the joining process performed on the electronic components structuring an electronic component built-in module, it is possible to lower the possibility of having flushing of the solder or having shifting of the positions of the pieces of solder within the electronic component built-in module, during the reflow process that is performed to install the electronic component built-in module on a device substrate or the like. With the electronic component built-in module in which the lead-free solder that is configured as described above is used, because it is possible to lower the possibility of having a defective joining process performed on the terminals of the electronic components and the like, it is possible to improve the yield.

Further, because the lead-free solder according to the present embodiment is configured in such a manner that the melting point thereof rises after the lead-free solder had once been melted and has subsequently become hard, the lead-free solder is effective in the use in a joining process performed on a portion that requires heat resistance. In that situation, the temperature that is observed when the lead-free solder according to the present embodiment is melted for the first time (approximately 220° C.) is equivalent to the melting temperature of Sn-based solder (i.e., solder of which the base material is Sn and may be, for example, Sn-3.5% Ag solder). Thus, there is no possibility that the workability during the joining process may become low. Further, it is possible to use the lead-free solder according to the present embodiment in manufacturing steps that are the same as the manufacturing steps in a conventionally-used soldering process. Thus, there is no need to form, in the manner of stacked layers, mutually different types of metal layers, which are alloyed to serve as a brazing material, over the terminal electrodes, by performing a plating process or the like. As a result, it is possible to make the workability significantly better than in the example with the technique disclosed in Japanese Laid-open Patent Publication No. 2001-62561 mentioned above. Furthermore, because the lead-free solder according to the present embodiment is configured by using relatively inexpensive metals such as Sn, Ni, and Fe, it is possible to inhibit increases in the manufacturing costs of the electronic component built-in module and the like better than in the example with the technique disclosed in Japanese Laid-open Patent Publication No. 2001-62561 mentioned above in which Ag or Au is sometimes used.

According to an aspect of the present invention, it is possible to inhibit the level of workability during a process to join two members together from becoming low. In the case where the solder is re-heated after the solder is used for joining two members together, it is possible to suppress the melting of the solder.

According to an aspect of the present invention, lead-free solder is obtained by adding a second metal that contains at least a Ni—Fe alloy to a first metal that contains Sn. In the lead-free solder, the reaction between the Sn contained in the first metal and the Ni—Fe alloy contained in the second metal progresses uniformly and quickly during the process in which the lead-free solder is melted for the first time. Thus, the composition of the lead-free solder that had once been melted and has subsequently become hard is close to be in a single phase of which the main components are Sn—Ni—Fe. As a result, the lead-free solder that had once been melted and has subsequently become hard has a melting point that is higher than the melting point thereof prior to the first melting and therefore has a higher level of heat resistance. Consequently, even if the lead-free solder is re-heated later, it is possible to suppress the melting of the lead-free solder that had once been melted so as to join two members together. Further, the lead-free solder according to an aspect of the present embodiment is able to join two members together by performing a process that is the same as the process performed when ordinary solder is used. Consequently, it is possible to inhibit the workability during the process to join the two members together from becoming low.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. Lead-free solder paste composition, before soldering, comprising:
    a first metal that (1) is a Sn—Ag-based metal or a Sn—Cu-based metal and (2) constitutes 70%-95% by mass of the lead-free solder;
    a second metal that contains at least a Ni—Fe alloy and contains no greater than 16% of Fe by mass; and
    a paste material, wherein the first metal and the second metal are in the form of separated particles and are dispersed in the paste material.

2. Lead-free solder, before soldering, comprising:
    a first metal (1) containing at least a Sn—Ag-based metal or a Sn—Cu-based metal forming an outer layer of a wire and (2) constituting 70%-95% by mass of the lead-free solder; and
    a second metal forming a core of the wire which is surrounded by the outer layer and containing at least a Ni—Fe alloy, and contains no greater than 16% of Fe by mass.

* * * * *